(12) United States Patent (10) Patent No.: US 11,495,467 B2
Goh et al. (45) Date of Patent: Nov. 8, 2022

(54) METHOD AND APPARATUS FOR ETCHING THIN LAYER

(71) Applicant: SEMES CO., LTD., Cheonan-si (KR)

(72) Inventors: Jung Suk Goh, Hwaseong-si (KR); Jae Seong Lee, Hwaseong-si (KR); Do Youn Lim, Hwaseong-si (KR); Kuk Saeng Kim, Goyang-si (KR); Young Dae Chung, Incheon (KR); Tae Shin Kim, Suwon-si (KR); Jee Young Lee, Incheon (KR); Won Geun Kim, Goyang-si (KR); Ji Hoon Jeong, Hwaseong-si (KR); Kwang Sup Kim, Asan-si (KR); Pil Kyun Heo, Hwaseong-si (KR); Yoon Ki Sa, Seoul (KR); Ye Rim Yeon, Hwaseong-si (KR); Hyun Yoon, Hwaseong-si (KR); Do Yeon Kim, Yongin-si (KR); Yong Jun Seo, Hwaseong-si (KR); Byeong Geun Kim, Incheon (KR); Young Je Um, Busan (KR)

(73) Assignee: SEMES CO., LTD., Cheonan-si (KR)

( * ) Notice: Subject to any disclaimer, the term of this patent is extended or adjusted under 35 U.S.C. 154(b) by 184 days.

(21) Appl. No.: 17/115,313

(22) Filed: Dec. 8, 2020

(65) Prior Publication Data

US 2021/0183660 A1 Jun. 17, 2021

(30) Foreign Application Priority Data

Dec. 13, 2019 (KR) .................. 10-2019-0166803

(51) Int. Cl.
*H01L 21/26* (2006.01)
*H01L 21/311* (2006.01)
*H01L 21/67* (2006.01)
*H01L 21/66* (2006.01)

(52) U.S. Cl.
CPC .. *H01L 21/31111* (2013.01); *H01L 21/67075* (2013.01); *H01L 21/67253* (2013.01); *H01L 22/20* (2013.01)

(58) Field of Classification Search
CPC ......... H01L 21/02019; H01L 21/31111; H01L 22/12; H01L 22/26
See application file for complete search history.

(56) References Cited

U.S. PATENT DOCUMENTS

2018/0090342 A1* 3/2018 Hinode ............ H01L 21/02057

* cited by examiner

*Primary Examiner* — Jae Lee
(74) *Attorney, Agent, or Firm* — Kile Park Reed & Houtteman PLLC

(57) ABSTRACT

Method and apparatus for etching a thin layer including silicon nitride formed on a substrate are disclosed. Etchant including phosphoric acid and water is supplied on the substrate so that a liquid layer is formed on the substrate. The thin layer is etched by reaction between the thin layer and the etchant. Thickness of the liquid layer is measured to detect variation in the thickness of the liquid layer while etching the thin layer. Variation in the concentration of the phosphoric acid and the water is calculated based on the variation in the thickness of the liquid layer. Water is supplied on the substrate based on the variation in the concentration of the phosphoric acid and the water so that the concentration of the phosphoric acid and the water becomes a predetermined value.

20 Claims, 4 Drawing Sheets

METHOD AND APPARATUS FOR ETCHING THIN LAYER

CROSS-REFERENCE TO RELATED APPLICATION

This application claims the priority benefit of Korean Patent Application No. 10-2019-0166803, filed on Dec. 13, 2019, and all the benefits accruing therefrom under 35 U.S.C. § 119, the contents of which are incorporated by reference in their entirety.

TECHNICAL FIELD

The present disclosure relates to a method and an apparatus for etching a thin layer. More particularly, the present disclosure relates to a method and an apparatus for etching and removing a thin layer formed on a substrate such as s silicon wafer.

BACKGROUND

Generally, semiconductor devices may be manufactured by manufacturing processes repeatedly performed on a silicon wafer. For example, a deposition process for forming a thin layer on a substrate, a photolithography process for forming a photoresist pattern on the thin layer, an etching process for patterning or removing the thin layer, etc., may be performed.

The etching process is classified into a dry etching process and a wet etching process. The wet etching process is classified into a single wafer type configured to process substrates piece by piece and a batch type configured to simultaneously process substrates. In a single wafer type etching apparatus, etchant is supplied on a rotating substrate, and the thin layer is removed through a reaction between the thin layer and the etchant. Etch residues and remaining etchant produced by the reaction is removed by the rotation of the substrate.

For example, when a thin layer including silicon nitride is formed on the substrate, the thin layer may be removed by etchant including phosphoric acid and water. In order to increase the speed of the reaction between the silicon nitride and the etchant, the etchant is heated and is then supplied on a central portion of the substrate. The etchant spreads from the central portion of the substrate toward an edge portion of the substrate by the rotation of the substrate, and reaction by-products and the etchant may be removed from the substrate by centrifugal force. However, in the case of the etching process of the single water type as described above, there is a problem that a relatively large amount of the etchant is required and the use efficiency of the etchant is poor.

SUMMARY

The embodiments of the present invention provide a method and an apparatus for etching a thin layer capable of reducing an amount of etchant used.

In accordance with an aspect of the present invention, a method of etching a thin layer may include supplying an etchant including phosphoric acid and water on a substrate in order to etch a thin layer including silicon nitride formed on the substrate so that a liquid layer maintained by a surface tension of the etchant is formed on the thin layer, etching the thin layer using a reaction between the thin layer and the etchant, measuring a thickness of the liquid layer to detect a variation in the thickness of the liquid layer while etching the thin layer, calculating a variation in concentration of the phosphoric acid and the water based on the variation in the thickness of the liquid layer, and supplying water on the substrate based on the variation in the concentration of the phosphoric acid and the water so that the concentration of the phosphoric acid and the water becomes a predetermined value.

In accordance with some embodiments of the present invention, the method may further include secondly measuring the thickness of the liquid layer after supplying of the water.

In accordance with some embodiments of the present invention, the method may further include secondly supplying the etchant on the substrate so that the secondly measured thickness of the liquid layer becomes a predetermined value.

In accordance with some embodiments of the present invention, the substrate may be rotated at a low speed within a range in which the liquid layer is maintained.

In accordance with some embodiments of the present invention, the method may further include heating the substrate to a predetermined temperature, and the etchant may be supplied on the substrate after heating the substrate.

In accordance with some embodiments of the present invention, the method may further include cooling the substrate to a temperature lower than a boiling point of the water before supplying the water, and heating the substrate to the predetermined temperature after supplying the water.

In accordance with some embodiments of the present invention, the etchant may be supplied on the substrate after being heated to a predetermined temperature.

In accordance with some embodiments of the present invention, the method may further include supplying water on the substrate to remove reaction by-products generated by the reaction between the thin layer and the etchant and remaining etchant, and rotating the substrate to remove the reaction by-products, the remaining etchant and the water from the substrate.

In accordance with another aspect of the present invention, an apparatus for etching a thin layer may include an etchant supply unit configured to supply an etchant including phosphoric acid and water on a substrate in order to etch a thin layer including silicon nitride formed on the substrate so that a liquid layer maintained by a surface tension of the etchant is formed on the thin layer, a thickness measurement unit configured to measure a thickness of the liquid layer while etching the thin layer by using a reaction between the thin layer and the etchant, a process control unit configured to detect a variation in the thickness of the liquid layer and to calculate a variation in concentration of the phosphoric acid and the water based on the variation in the thickness of the liquid layer, and a water supply unit configured to supply water on the substrate based on the variation in the concentration of the phosphoric acid and the water so that the concentration of the phosphoric acid and the water becomes a predetermined value.

In accordance with some embodiments of the present invention, the thickness measurement unit may secondly measure the thickness of the liquid layer after the water is supplied, and the etchant supply unit may secondly supply the etchant on the substrate so that the thickness of the liquid layer becomes a predetermined value.

In accordance with some embodiments of the present invention, the apparatus may further include a rotation driving unit configured to rotate the substrate at a first speed within a range in which the liquid layer is maintained on the substrate.

In accordance with some embodiments of the present invention, the water supply unit may supply water on the substrate to remove reaction by-products generated by the reaction between the thin layer and the etchant and remaining etchant, and the rotation driving unit may rotate the substrate at a second speed faster than the first speed to remove the reaction by-products, the remaining etchant, and the water from the substrate.

In accordance with some embodiments of the present invention, the apparatus may further include a bowl unit configured to surround the substrate to collect the reaction by-products, the remaining etchant, and the water.

In accordance with some embodiments of the present invention, the thickness measurement unit may include a light emitting part and a light receiving part respectively disposed on both outer sides of the bowl unit, and the bowl unit may include windows so that light irradiated from the light emitting part reaches the light receiving part.

In accordance with some embodiments of the present invention, the apparatus may further include a heater configured to heat the substrate to a predetermined temperature, and the etchant may be supplied on the substrate heated by the heater.

In accordance with some embodiments of the present invention, the apparatus may further include a support unit configured to support the substrate. The support unit may include a support head having a circular plate shape and support pins disposed on the support head to support edge portions of the substrate, and the heater may include a plurality of infrared lamps disposed on the support head.

In accordance with some embodiments of the present invention, a plurality of recesses may be formed in upper surface portions of the support head, the infrared lamps may be disposed in the recesses, and a plurality of windows may be disposed above the infrared lamps to cover upper portions of the recesses.

In accordance with some embodiments of the present invention, the apparatus may further include a substrate cooling unit configured to cool the substrate to a temperature lower than a boiling point of the water before supplying the water, and the heater may heat the substrate to the predetermined temperature after supplying the water.

In accordance with some embodiments of the present invention, the apparatus may further include a support unit configured to support the substrate. The support unit may include a support head having a circular plate shape and support pins disposed on the support head to support edge portions of the substrate, and the substrate cooling unit may include a plurality of gas spray nozzles disposed on the support head and configured to spray a cooling gas onto a lower surface of the substrate.

In accordance with some embodiments of the present invention, the apparatus may further include a temperature measurement unit disposed above the substrate and configured to measure a temperature of the substrate.

The above summary of the invention is not intended to describe each illustrated embodiment or every implementation of the present invention. The detailed description and claims that follow more particularly exemplify these embodiments.

BRIEF DESCRIPTION OF THE DRAWINGS

Embodiments of the present invention can be understood in more detail from the following description taken in conjunction with the accompanying drawings, in which.

Figure 1:
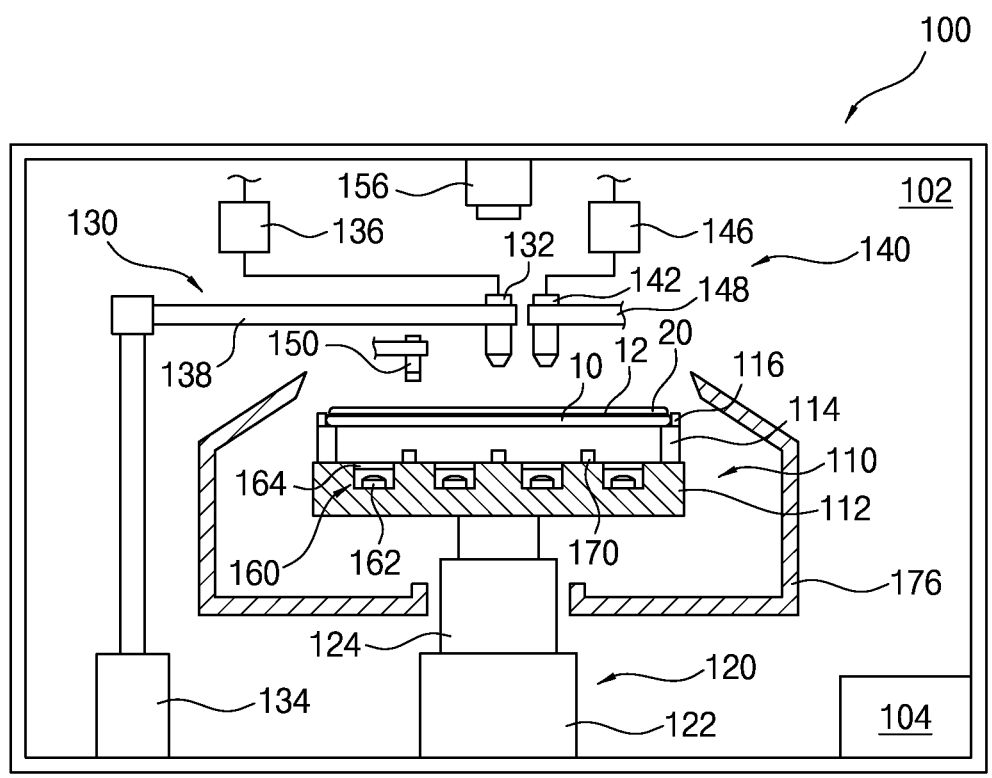
FIG. 1 is a schematic view illustrating an apparatus for etching a thin layer in accordance with an embodiment of the present invention.

While various embodiments are amenable to various modifications and alternative forms, specifics thereof have been shown by way of example in the drawings and will be described in detail. It should be understood, however, that the intention is not to limit the claimed inventions to the particular embodiments described. On the contrary, the intention is to cover all modifications, equivalents, and alternatives falling within the spirit and scope of the subject matter as defined by the claims.

DETAILED DESCRIPTION

Hereinafter, embodiments of the present invention are described in more detail with reference to the accompanying drawings. However, the present invention is not limited to the embodiments described below and is implemented in various other forms. Embodiments below are not provided to fully complete the present invention but rather are provided to fully convey the range of the present invention to those skilled in the art.

In the specification, when one component is referred to as being on or connected to another component or layer, it can be directly on or connected to the other component or layer, or an intervening component or layer may also be present. Unlike this, it will be understood that when one component is referred to as directly being on or directly connected to another component or layer, it means that no intervening component is present. Also, though terms like a first, a second, and a third are used to describe various regions and layers in various embodiments of the present invention, the regions and the layers are not limited to these terms.

Terminologies used below are used to merely describe specific embodiments, but do not limit the present invention. Additionally, unless otherwise defined here, all the terms including technical or scientific terms, may have the same meaning that is generally understood by those skilled in the art.

Embodiments of the present invention are described with reference to schematic drawings of ideal embodiments. Accordingly, changes in manufacturing methods and/or allowable errors may be expected from the forms of the drawings. Accordingly, embodiments of the present invention are not described being limited to the specific forms or areas in the drawings, and include the deviations of the forms. The areas may be entirely schematic, and their forms may not describe or depict accurate forms or structures in any given area, and are not intended to limit the scope of the present invention.

Figure 2:
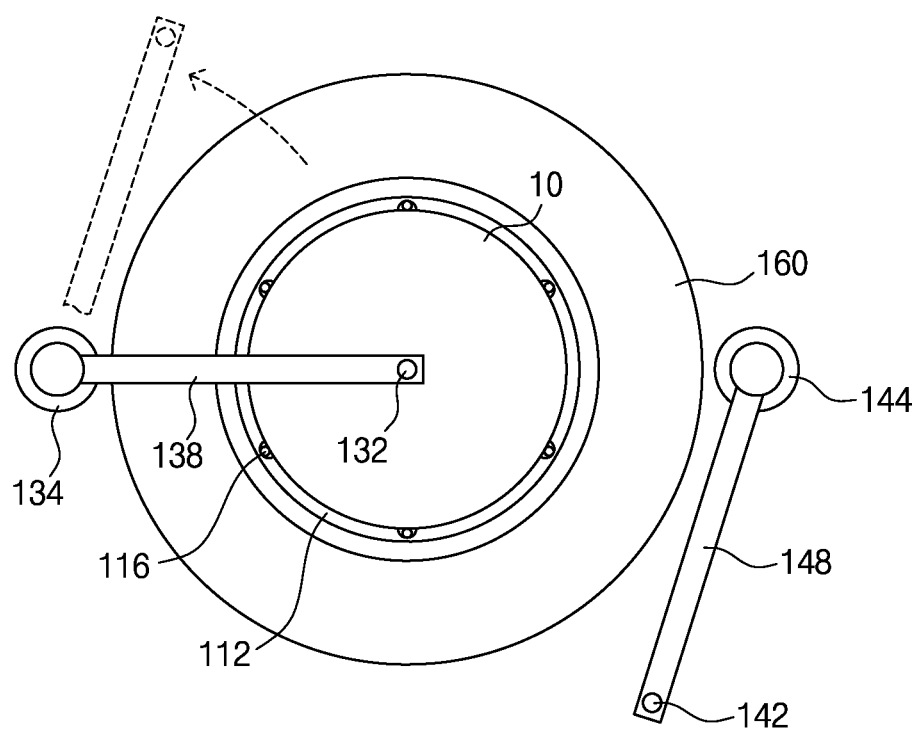
FIG. 2 is a plan view illustrating an etchant supply unit and a water supply unit as shown in FIG. 1.

FIG. 1 is a schematic view illustrating an apparatus for etching a thin layer in accordance with an embodiment of the present invention, and FIG. 2 is a plan view illustrating an etchant supply unit and a water supply unit as shown in FIG. 1.

Referring to FIGS. 1 and 2, an apparatus 100 for etching a thin layer according to an embodiment of the present invention may be used to remove a thin layer 12 formed on a substrate 10 such as a silicon wafer during a process for manufacturing a semiconductor device. For example, a thin layer 12 including silicon nitride ($Si_3N_4$) may be formed on the substrate 10, and the thin layer etching apparatus 100 may supply etchant 20 including phosphoric acid ($H_3PO_4$) and water ($H_2O$) on the substrate 10, and remove the thin layer 12 using etching reaction between the thin layer 12 and the etchant 20.

According to an embodiment of the present invention, the thin layer etching apparatus 100 may include a process chamber 102, in which the etching process for removing the thin layer 12 is performed. A support unit 110 configured to support the substrate 10 and a rotation driving unit 120 configured to rotate the support unit 110 may be disposed in the process chamber 102.

For example, the support unit 110 may include a support head 112 having a circular plate shape and a plurality of support pins 114 disposed on the support head 112 to support edge portions of the substrate 10. The support pins 114 may be arranged in a circular ring shape to support the edge portions of the substrate 10. A plurality of support members 116 configured to support side portions of the substrate 10 may be respectively disposed on the support pins 114 during the rotation of the substrate 10. The rotation driving unit 120 may include a rotation driving part 122 disposed under the support head 112 and including a motor providing rotational force, and a rotating shaft 124 connecting the rotation driving part 122 and the support head 112.

The thin layer etching apparatus 100 may include an etchant supply unit 130 configured to supply etchant 20 on the substrate 10 to etch the thin layer 12. For example, the etchant supply unit 130 may include an etchant supply nozzle 132 configured to supply the etchant 20 on a central portion of the substrate 10, a nozzle driving part 134 configured to move the etchant supply nozzle 132 in a horizontal direction, and an etchant heating part 136 configured to heat the etchant 20 to a predetermined temperature.

Meanwhile, the thin layer 12 including the silicon nitride may be removed by a chemical reaction between the silicon nitride and the etchant 20 including phosphoric acid and water. Reaction formula between the thin layer 12 and the etchant 20 is as follows.

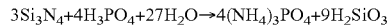

$$3Si_3N_4 + 4H_3PO_4 + 27H_2O \rightarrow 4(NH_4)_3PO_4 + 9H_2SiO_3$$

In the above reaction, a reaction speed may be increased by a temperature of the etchant 20, and the etchant heating part 136, for example, may heat the etchant 20 at a temperature of about 150° C., which is lower than a boiling point of the etchant 20, in order to increase an etch rate of the thin layer 12.

According to an embodiment of the present invention, the etching process on the thin layer 12 may be performed in a puddle method. In particular, the etchant supply unit 130 may supply the etchant 20 in a predetermined amount on a central portion of the substrate 10, and the rotation driving unit 120 may rotate the substrate 10 at a low speed to entirely spread the etchant 20 on an upper surface of the substrate 10 to form a liquid layer of a predetermined thickness thereon. That is, the etchant 20 supplied on the substrate 10 may spread from the central portion of the substrate 10 toward the edge portion of the substrate 10 by centrifugal force. After the etchant 20 sufficiently spreads toward the edge portion of the substrate 10, the etchant 20 forms the liquid layer at a predetermined thickness by surface tension. As described above, the etching process for the thin layer 12 may be performed for a predetermined time by the etchant 20 after forming the liquid layer.

The thin layer etching apparatus 100 may include a thickness measurement unit 150 configured to measure the thickness of the liquid layer while etching the thin layer 12 using the reaction between the thin layer 12 and the etchant 20. For example, the thickness measurement unit 150 may be disposed above the substrate 10. Although not shown in figures, the thickness measurement unit 150 may include a light emitting part configured to irradiate light onto the substrate 10 and a light receiving part configured to receive the light reflected from the substrate 10 after being refracted by the liquid layer.

Meanwhile, the concentration of phosphoric acid and water may change due to dehydration caused by the reaction of the silicon nitride with phosphoric acid and water. That is, because the amount of water consumed in the etching reaction is relatively greater than that of the phosphoric acid, the concentration of the phosphoric acid and water may be changed as the etching reaction proceeds. A variation in the concentration of the phosphoric acid and water may be calculated by a variation in the thickness of the liquid layer.

The thin layer etching apparatus 100 may include a process control unit 104 configured to detect the variation in the thickness of the liquid layer from signals of the thickness measurement unit 150 and to calculate the variation in the concentration of the phosphoric acid and water based on the variation in the thickness of the liquid layer.

The thin layer etching apparatus 100 may include a water supply unit 140 configured to supply water, such as deionized water, on the substrate based on the variation in the concentration of the phosphoric acid and water calculated by the process control unit 104 so that the concentration of the phosphoric acid and water becomes a predetermined value. The process control unit 104 may control the operation of the water supply unit 140 based on the calculated concentration of the phosphoric acid and water. Thus, the concentration of the phosphoric acid and water on the substrate 10 may be maintained at the predetermined value.

For example, the water supply unit 140 may include a water supply nozzle 142 configured to supply water on the central portion of the substrate 10, a second nozzle driving part 144 (shown in FIG. 2) configured to move the water supply nozzle 142 in a horizontal direction, and a water heating part 146 configured to heat the water at a predetermined temperature.

The nozzle driving part 134 may be connected to the etchant supply nozzle 132 by a nozzle arm 138. The nozzle driving part 134 may rotate the nozzle arm 138 so that the etchant supply nozzle 132 is disposed above the central portion of the substrate 10. The nozzle driving part 134 may rotate the nozzle arm 138 so that the etchant supply nozzle 132 is spaced apart from the substrate 10 after the etchant 20 is supplied. The second nozzle driving part 144 may be connected to the water supply nozzle 142 by a second nozzle arm 148, and may rotate the second nozzle arm 148 so that the water supply nozzle 142 is disposed above the central portion of the substrate 10 after the etchant 20 is supplied. The second nozzle driving part 144 may rotate the second nozzle arm 148 so that the water supply nozzle 142 is spaced apart from the substrate 10 for a subsequent step for supplying the etchant 20.

The thin layer etching apparatus 100 may include a heater 160 configured to heat the substrate 10 to a predetermined temperature. The heater 160 may be disposed under the substrate 10 and may include a plurality of infrared lamps 162 disposed on the support head 112. For example, the heater 160 may include a plurality of infrared lamps 162 disposed in the support head 112, and the support head 112 may include a plurality of quartz windows 164 configured to transmit infrared lights irradiated from the infrared lamps 162 towards a lower surface of the substrate 10. Specifically, a plurality of recesses may be formed in upper surface portions of the support head 112, and the infrared lamps 162 may be disposed in the recesses. In such case, the quartz windows 164 may be disposed above the infrared lamps 162 to cover upper portions of the recesses.

For example, the heater 160 may heat the substrate 10 to a temperature of about 100° C. or higher to increase the etch rate of the thin layer 12. The etchant 20 heated by the etchant heating part 136 may be supplied to the substrate 10 heated by the heater 160.

Meanwhile, when the water is supplied on the substrate 10 to control the concentration of the phosphoric acid and water, the water may be evaporated while supplying the water if the temperature of the substrate 10 is higher than the boiling point of the water. According to an embodiment of the present invention, in order to prevent the evaporation of the water, the thin layer etching apparatus 100 may include a substrate cooling unit 170 configured to cool the substrate 10 to a temperature of lower than 100° C., for example, about 90 to about 99° C.

For example, the substrate cooling unit 170 may be disposed on the support head 112, and may include a plurality of gas spray nozzles configured to spray a cooling gas such as dry air toward a lower surface of the substrate 10. Further, the water heating part 146 may heat the water supplied onto the substrate 10 to a temperature equal to the temperature of the substrate 10, which is lower than 100° C., for example, about 90 to about 99° C. The heater 160 may reheat the substrate 10 to the predetermined temperature after the water is supplied. Meanwhile a temperature measurement unit 156, for example, a thermal imaging camera, for measuring the temperature of the substrate 10, may be disposed above the substrate 10.

Further, the thickness measurement unit 150 may secondly measure the thickness of the liquid layer after the water is supplied, and the etchant supply unit 130 may secondly supply the etchant 20 on the substrate 10 so that the thickness of the liquid layer becomes a predetermined value. As a result, the liquid layer on the substrate 10 may maintains a constant concentration and a constant thickness by the supply of the water and the second supply of the etchant 20. Thus, the etching process on the thin layer 12 may be more uniformly performed on entire of the substrate 10.

According to an embodiment of the present invention, the thin layer etching apparatus 100 may include a bowl unit 176 configured to surround the substrate 10 to collect the etchant 20. For example, in order to remove reaction by-products and remaining etchant on the substrate 10 after the etching process, the rotation driving unit 120 may rotate the substrate 10 at a high speed, and the reaction by-products and the remaining etchant may be removed from the substrate 10 by centrifugal force. The reaction by-products and the remaining etchant removed from the substrate 10 may be collected by the bowl unit 176, and may be discharged through a discharge pipe (not shown) connected to the bowl unit 176.

As shown in FIG. 1, the bowl unit 176 includes one bowl. However, as another example, the bowl unit 176 may include a plurality of bowls. For example, after the etching process is performed, a rinsing process for removing etch residues from the substrate 10 and a drying process for drying the substrate 10 may be performed. Also, the bowl unit 176 may further include a second bowl (not shown) configured to collect a rinsing liquid, for example, deionized water used for the rinsing process, and a third bowl (not shown) configured to collect a drying liquid, for example, isopropyl alcohol used for the drying process. Also, although not shown in the figure, the thin layer etching apparatus 100 may further include a rinsing liquid supply unit configured to supply the rinsing liquid and a drying liquid supply unit configured to supply the drying liquid.

Figure 3:
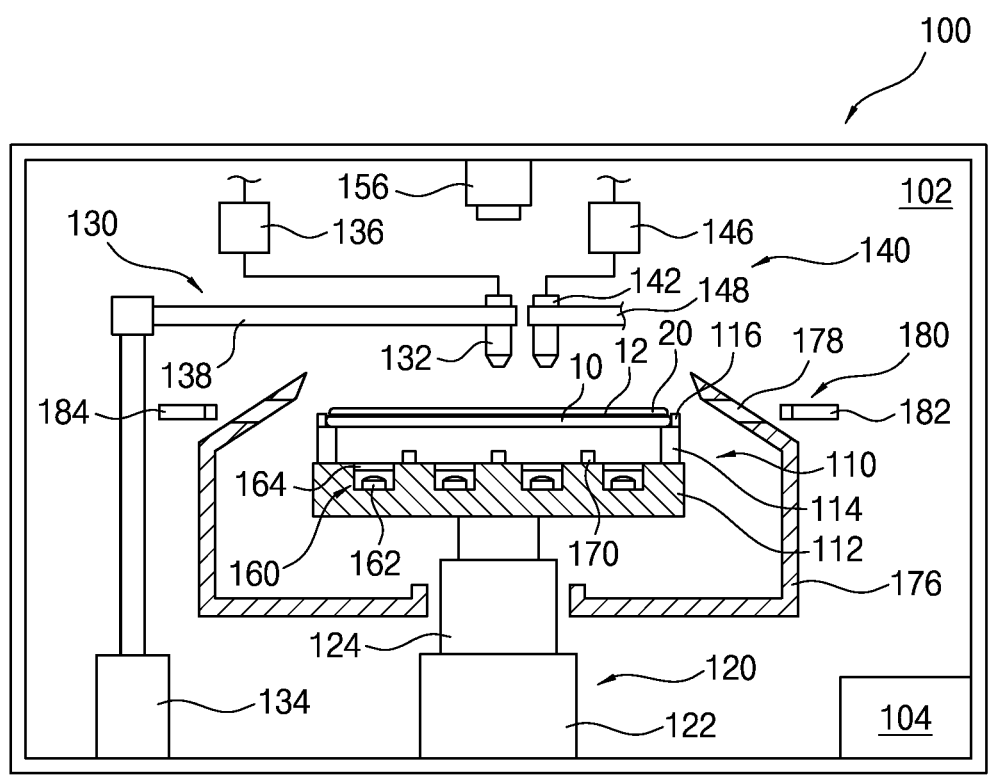
FIG. 3 is a schematic view illustrating an apparatus for etching a thin layer in accordance with another embodiment of the present invention.

FIG. 3 is a schematic view illustrating an apparatus for etching a thin layer according to another embodiment of the present invention.

Referring to FIG. 3, the thin layer etching apparatus 100 includes a thickness measurement unit 180 configured to measure the thickness of the liquid layer formed on the substrate 10. The thickness measurement unit 180 may include a light emitting part 182 and a light receiving part 184 respectively disposed on both outer sides of the bowl unit 176. The bowl unit 176 may include quartz windows 178 so that the light irradiated from the light emitting part 182 is received in the light receiving part 184.

Figure 4:
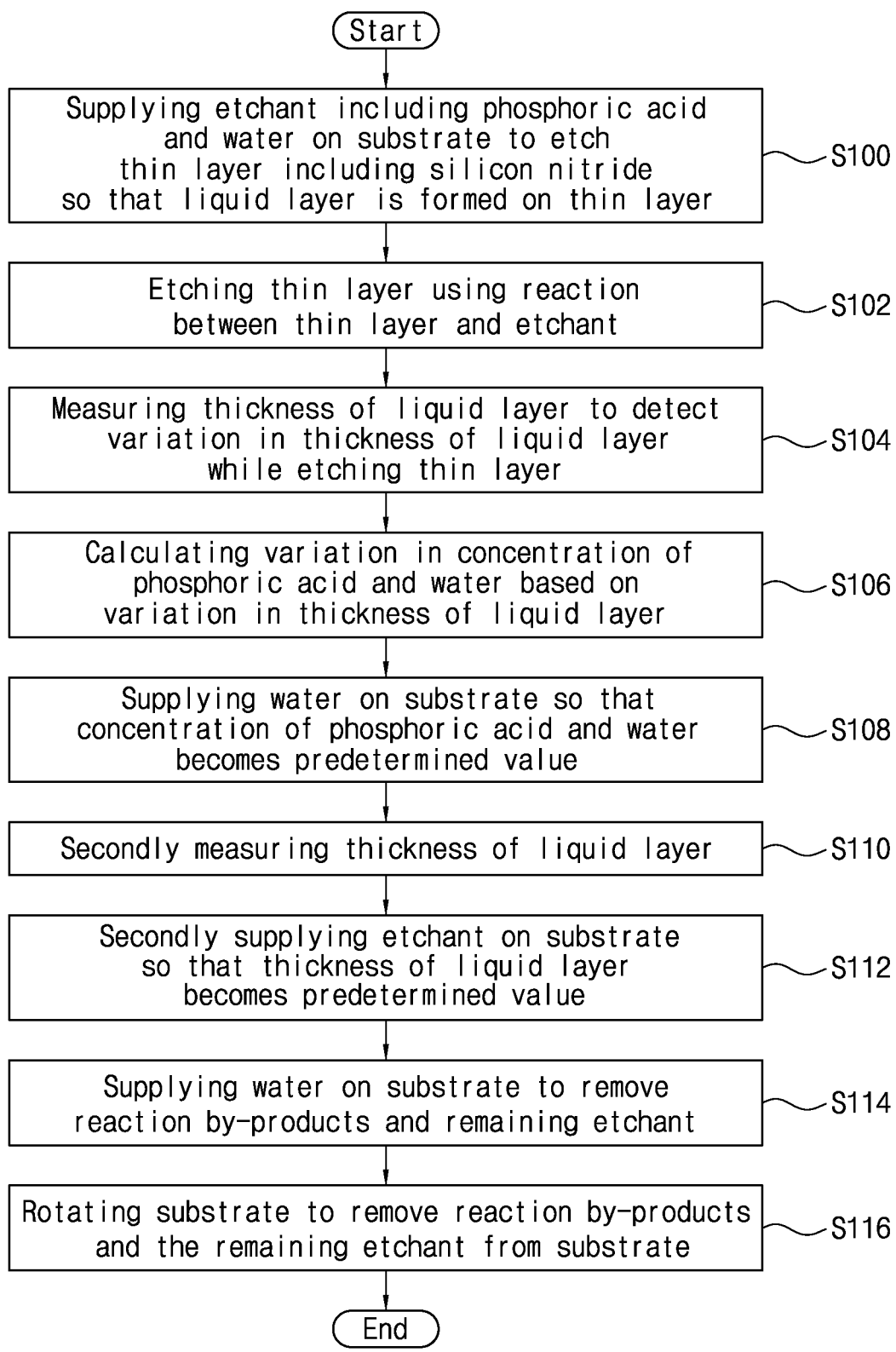
FIG. 4 is a flow chart illustrating a method of etching a thin layer using the apparatus for etching the thin layer as shown in FIG. 1.

FIG. 4 is a flow chart illustrating a method of etching a thin layer using the apparatus for etching the thin layer as shown in FIG. 1.

Referring to FIG. 4, in step S100, the etchant 20 may be supplied on the substrate 10 to form a liquid layer on the substrate 10 at a predetermined thickness. The etchant 20 may be supplied on a central portion of the substrate 10 in a predetermined amount by the etchant supply unit 130. Also, the etchant 20 may be heated to a predetermined temperature by the etchant heating part 136, and may then be supplied on the substrate 10. The substrate 10 may be rotated at a low speed (first speed) within a range in which the etchant 20 does not flow down to the side portion of the substrate 10. Thus, the etchant 20 may sufficiently spread on the substrate 10. In particular, the liquid layer may be maintained by surface tension of the etchant 20 during the rotation of the substrate 10 at the first speed.

In step S102, the thin layer 12 may be etched using the reaction between the thin layer 12 and the etchant 20. In step S104, the thickness of the liquid layer may be measured to detect the variation of the thickness of the liquid layer while etching the thin layer 12. The thickness of the liquid layer may be measured by the thickness measurement unit 150, and output signals of the thickness measurement unit 150 may be transmitted to the process control unit 104. The process control unit 104 may detect the variation in the thickness of the liquid layer by the variation of the signals of the thickness measurement unit 150.

Meanwhile, although not shown in FIG. 4, a step of heating the substrate 10 to a predetermined temperature may be performed by the heater 160, and the etchant 20 may be supplied on the heated substrate 10. The rotation driving unit 120 may rotate the substrate 10 at the slow speed (the first speed) during the supply of the etchant 20 and the etching reaction. Here, the first speed may be determined within a range in which the liquid layer is maintained on the substrate 10 by surface tension of the etchant 20.

In step S106, the process control unit 104 may calculate a variation in concentration of the phosphoric acid and water based on the variation in the thickness of the liquid layer. In step S108, the water supply unit 140 may supply water on the substrate 10 based on the variation in the concentration of the phosphoric acid and water so that the concentration of the phosphoric acid and water becomes a predetermined value.

In step S110, the thickness measurement unit 150 may secondly sense the thickness of the liquid layer after the supply of the water (step S108). In step S112, the etchant supply unit 130 may secondly supply the etchant 20 on the substrate 10 so that the secondly measured thickness of the liquid layer becomes a predetermined value.

Also, although not shown in FIG. 4, before the supply of the water (step S108), the substrate 10 may be cooled to a temperature lower than a boiling point of the water by the substrate cooling unit 170, and after the supply of the water (step S108), the substrate 10 may be heated to a predetermined temperature by the heater 160.

While the above-described steps are performed, the thin layer 12 may be removed from the substrate 10 by the reaction between the thin layer 12 and the etchant 20, and the substrate 10 may be rotated at the first speed. In particular, the water may be supplied onto the substrate 10 while the substrate 10 is rotated at the first speed, and thus the mixing of the etchant 20 on the substrate 10 and the supplied water may be performed relatively quickly compared to a state in which the rotation of the substrate 10 is stopped.

Meanwhile, reaction by-products may be generated by the reaction between the thin layer 12 and the etchant 20. As the amount of the reaction by-products is increased, the reaction speed between the thin layer 12 and the etchant 20 may be decreased. In accordance with an embodiment of the present invention, the water supply unit 140 may supply water on the substrate 10 to remove the reaction by-products and remaining etchant in step S114, and the rotation driving unit 120 may rotate the substrate 10 at a second speed, which is faster than the first speed, to remove the reaction by-products, the remaining etchant, and the water from the substrate 10 in step S116.

According to the embodiments of the present invention, when the concentration of the phosphoric acid and water is changed by the reaction between the thin layer 12 and the etchant 20, that is, when the proportion of the water is decreased, water may be replenished on the substrate 10 so that the concentration of the phosphoric acid and water maintains at a predetermined concentration. Also, the etchant 20 may be replenished on the substrate 10 to maintain the thickness of the liquid layer at a constant thickness. Further, since the process for etching the thin layer 12 is performed in a puddle method, the used amount of the etchant 20 may be greatly decreased. Also, the concentration of the phosphoric acid and water and the thickness of the liquid layer may maintain at a constant value during the etching process, and thus, the etching uniformity for the thin layer 12 may be greatly improved.

Although the example embodiments of the present invention have been described with reference to the specific embodiments, they are not limited thereto. Therefore, it will be readily understood by those skilled in the art that various modifications and changes can be made thereto without departing from the spirit and scope of the appended claims.

The invention claimed is:

1. A method of etching a thin layer comprising:
   supplying an etchant including phosphoric acid and water on a substrate in order to etch a thin layer including silicon nitride formed on the substrate so that a liquid layer maintained by a surface tension of the etchant is formed on the thin layer;
   etching the thin layer using a reaction between the thin layer and the etchant;
   measuring a thickness of the liquid layer to detect a variation in the thickness of the liquid layer while etching the thin layer;
   calculating a variation in concentration of the phosphoric acid and the water based on the variation in the thickness of the liquid layer; and
   supplying water on the substrate based on the variation in the concentration of the phosphoric acid and the water so that the concentration of the phosphoric acid and the water becomes a predetermined value.

2. The method of etching the thin layer of claim 1, further comprising secondly measuring the thickness of the liquid layer after supplying of the water.

3. The method of etching the thin layer of claim 2, further comprising secondly supplying the etchant on the substrate so that the secondly measured thickness of the liquid layer becomes a predetermined value.

4. The method of etching the thin layer of claim 1, wherein the substrate is rotated at a low speed within a range in which the liquid layer is maintained.

5. The method of etching the thin layer of claim 1, further comprising heating the substrate to a predetermined temperature,
   wherein the etchant is supplied on the substrate after heating the substrate.

6. The method of etching the thin layer of claim 5, further comprising:
   cooling the substrate to a temperature lower than a boiling point of the water before supplying the water; and
   heating the substrate to the predetermined temperature after supplying the water.

7. The method of etching the thin layer of claim 1, wherein the etchant is supplied on the substrate after being heated to a predetermined temperature.

8. The method of etching the thin layer of claim 1, further comprising:
   supplying water on the substrate to remove reaction by-products generated by the reaction between the thin layer and the etchant and remaining etchant; and
   rotating the substrate to remove the reaction by-products, the remaining etchant and the water from the substrate.

9. An apparatus for etching a thin layer comprising:
   an etchant supply unit configured to supply an etchant including phosphoric acid and water on a substrate in order to etch a thin layer including silicon nitride formed on the substrate so that a liquid layer maintained by a surface tension of the etchant is formed on the thin layer;
   a thickness measurement unit configured to measure a thickness of the liquid layer while etching the thin layer by using a reaction between the thin layer and the etchant;
   a process control unit configured to detect a variation in the thickness of the liquid layer and to calculate a variation in concentration of the phosphoric acid and the water based on the variation in the thickness of the liquid layer; and
   a water supply unit configured to supply water on the substrate based on the variation in the concentration of the phosphoric acid and the water so that the concentration of the phosphoric acid and the water becomes a predetermined value.

10. The apparatus for etching the thin layer of claim 9, wherein the thickness measurement unit secondly measures the thickness of the liquid layer after the water is supplied, and the etchant supply unit secondly supplies the etchant on the substrate so that the thickness of the liquid layer becomes a predetermined value.

11. The apparatus for etching the thin layer of claim 9, further comprising a rotation driving unit configured to rotate the substrate at a first speed within a range in which the liquid layer is maintained on the substrate.

12. The apparatus for etching the thin layer of claim 11, wherein the water supply unit supplies water on the substrate to remove reaction by-products generated by the reaction between the thin layer and the etchant and remaining etchant, and the rotation driving unit rotates the substrate at a second speed faster than the first speed to remove the reaction by-products, the remaining etchant, and the water from the substrate.

13. The apparatus for etching the thin layer of claim 12, further comprising a bowl unit configured to surround the substrate to collect the reaction by-products, the remaining etchant, and the water.

14. The apparatus for etching the thin layer of claim 13, wherein the thickness measurement unit comprises a light emitting part and a light receiving part respectively disposed on both outer sides of the bowl unit, and the bowl unit comprises windows so that light irradiated from the light emitting part reaches the light receiving part.

15. The apparatus for etching the thin layer of claim 9, further comprising a heater configured to heat the substrate to a predetermined temperature, wherein the etchant is supplied on the substrate heated by the heater.

16. The apparatus for etching the thin layer of claim 15, further comprising a support unit configured to support the substrate, wherein the support unit comprises a support head having a circular plate shape and support pins disposed on the support head to support edge portions of the substrate, and the heater comprises a plurality of infrared lamps disposed on the support head.

17. The apparatus for etching the thin layer of claim 16, wherein a plurality of recesses is formed in upper surface portions of the support head, the infrared lamps are disposed in the recesses, and a plurality of windows is disposed above the infrared lamps to cover upper portions of the recesses.

18. The apparatus for etching the thin layer of claim 15, further comprising a substrate cooling unit configured to cool the substrate to a temperature lower than a boiling point of the water before supplying the water, wherein the heater heats the substrate to the predetermined temperature after supplying the water.

19. The apparatus for etching the thin layer of claim 18, further comprising a support unit configured to support the substrate, wherein the support unit comprises a support head having a circular plate shape and support pins disposed on the support head to support edge portions of the substrate, and the substrate cooling unit comprises a plurality of gas spray nozzles disposed on the support head and configured to spray a cooling gas onto a lower surface of the substrate.

20. The apparatus for etching the thin layer of claim 15, further comprising a temperature measurement unit disposed above the substrate and configured to measure a temperature of the substrate.

* * * * *